(12) United States Patent
Forbes et al.

(10) Patent No.: US 6,809,985 B2
(45) Date of Patent: Oct. 26, 2004

(54) DRAM TECHNOLOGY COMPATIBLE PROCESSOR/MEMORY CHIPS

(75) Inventors: Leonard Forbes, Corvallis, OR (US); Eugene H. Cloud, Boise, ID (US); Wendell P. Noble, Milton, VT (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/191,332

(22) Filed: Jul. 9, 2002

(65) Prior Publication Data

US 2002/0176314 A1 Nov. 28, 2002

Related U.S. Application Data

(62) Division of application No. 09/261,598, filed on Feb. 26, 1999, now Pat. No. 6,452,856.

(51) Int. Cl.[7] .................................................. G11C 8/00
(52) U.S. Cl. ............................ 365/230.06; 365/185.17; 365/149; 326/105; 326/106
(58) Field of Search ....................... 365/230.06, 185.17, 365/149; 326/105, 106

(56) References Cited

U.S. PATENT DOCUMENTS

| | | | |
|---|---|---|---|
| 3,590,337 A | 6/1971 | Wegener | 317/234 |
| 4,051,354 A | 9/1977 | Choate | 235/312 |
| 4,646,271 A | 2/1987 | Uchiyama et al. | |
| 4,652,777 A | 3/1987 | Cline | 307/469 |
| 4,703,456 A | 10/1987 | Arakawa | |
| 4,713,677 A | 12/1987 | Tigelaar et al. | 357/23.5 |
| 4,720,323 A | 1/1988 | Sato | |
| 4,757,360 A | 7/1988 | Faraone et al. | |
| 4,761,768 A | 8/1988 | Turner et al. | 365/201 |
| 4,766,569 A | 8/1988 | Turner et al. | 365/185 |
| 4,799,194 A | 1/1989 | Arakawa | |

(List continued on next page.)

OTHER PUBLICATIONS

Abbas, S..A. , et al. ,"N–Channel lgfet Design Limitations Due to Hot Electron Trapping", *Technical Digest, International Electron Devices Meeting,,* Wahington, DC, (Dec. 1975),pp. 35–38.

Bude, J..D. ,et al. ,"Secondary Electron Flash—a High Performance, Low Power Flash Technology for 0.35 micrometer and Below", *International Electron Devices Meeting, Technical Digest,* Held in Washngton, D.C.,(Dec. 7–10, 1997),279–282.

(List continued on next page.)

*Primary Examiner*—Connie C. Yoha
(74) *Attorney, Agent, or Firm*—Schwegman, Lundberg, Woessner & Kluth, P.A.

(57) ABSTRACT

The present invention includes a programmable logic array having a first logic plane that receives a number of input signals. The first logic plane has a plurality of non-volatile memory cells arranged in rows and columns that are interconnected to provide a number of logical outputs. A number of non-volatile memory cells arranged in rows and columns of a second logic plane receive the outputs of the first logic plane and are interconnected to produce a number of logical outputs such that the programmable logic array implements a logical function. Each non-volatile memory cell includes a MOSFET. Each non-volatile memory cell includes a stacked capacitor formed according to a DRAM process. Each nonvolatile memory cell includes an electrical contact that couples the stacked capacitor to a gate of the MOSFET. The present invention also includes methods for producing the Ics and arrays.

48 Claims, 5 Drawing Sheets

U.S. PATENT DOCUMENTS

| | | |
|---|---|---|
| 4,813,018 A | 3/1989 | Kobayashi et al. |
| 5,051,958 A | 9/1991 | Arakawa |
| 5,057,448 A | 10/1991 | Kuroda .................. 438/258 |
| 5,065,201 A | 11/1991 | Yamauchi |
| 5,075,888 A | 12/1991 | Yamauchi et al. |
| 5,089,641 A | 2/1992 | DeLuca et al. |
| 5,175,120 A | 12/1992 | Lee ........................ 437/48 |
| 5,189,641 A | 2/1993 | Arakawa |
| 5,196,722 A | 3/1993 | Bergendahl et al. ........ 257/304 |
| 5,247,346 A | 9/1993 | Hazani .................. 257/314 |
| 5,250,827 A | 10/1993 | Inoue et al. |
| 5,250,857 A | 10/1993 | Miyazaki .............. 307/449 |
| 5,281,548 A | 1/1994 | Prall ...................... 437/43 |
| 5,292,681 A | 3/1994 | Lee et al. ................ 437/48 |
| 5,324,681 A | 6/1994 | Lowrey et al. .......... 437/52 |
| 5,327,380 A | 7/1994 | Kersh, III et al. ........ 365/195 |
| 5,331,188 A | 7/1994 | Acovic et al. ........... 257/298 |
| 5,347,490 A | 9/1994 | Terada et al. ........... 365/219 |
| 5,389,567 A | 2/1995 | Acovic et al. ........... 437/52 |
| 5,397,727 A | 3/1995 | Lee et al. ................ 437/43 |
| 5,399,516 A | 3/1995 | Bergendahl et al. |
| 5,416,735 A | 5/1995 | Onishi et al. ........... 365/145 |
| 5,442,210 A | 8/1995 | Kanehachi |
| 5,488,579 A | 1/1996 | Sharma et al. |
| 5,496,756 A | 3/1996 | Sharma et al. |
| 5,591,658 A | 1/1997 | Cacharelis .............. 438/201 |
| 5,595,929 A | 1/1997 | Tseng ..................... 437/52 |
| 5,598,367 A | 1/1997 | Noble ..................... 365/149 |
| 5,612,238 A | 3/1997 | Sato et al. ................ 437/43 |
| 5,621,233 A | 4/1997 | Sharma et al. .......... 257/316 |
| 5,702,988 A | 12/1997 | Liang ..................... 438/238 |
| 5,723,375 A | 3/1998 | Ma et al. ................ 438/258 |
| 5,748,530 A | 5/1998 | Gotou et al. ........... 365/185.18 |
| 5,763,913 A | 6/1998 | Jeong ..................... 257/316 |
| 5,764,096 A | 6/1998 | Lipp et al. .............. 327/434 |
| 5,825,609 A | 10/1998 | Andricacos et al. ..... 361/321.4 |
| 5,880,991 A | 3/1999 | Hsu et al. ............... 365/182 |
| 5,886,379 A | 3/1999 | Jeong ..................... 257/319 |
| 5,908,311 A | 6/1999 | Chi et al. ............... 438/258 |
| 5,912,840 A | 6/1999 | Gonzalez et al. ...... 365/185.05 |
| 5,914,904 A | 6/1999 | Sansbury ............... 365/218 |
| 5,981,335 A | 11/1999 | Chi ........................ 438/253 |
| 5,998,250 A | 12/1999 | Andricacos et al. ...... 438/240 |
| 6,015,986 A | 1/2000 | Schuegraf ............... 257/303 |
| 6,021,066 A | 2/2000 | Lam |
| 6,101,131 A | 8/2000 | Chang |
| 6,118,695 A | 9/2000 | Yoneyama |
| 6,141,242 A | 10/2000 | Hsu et al. |
| 6,141,248 A | 10/2000 | Forbes et al. |
| 6,232,173 B1 | 5/2001 | Hsu et al. .............. 438/253 |
| 6,245,613 B1 | 6/2001 | Hsu et al. |
| 6,256,225 B1 | 7/2001 | Noble et al. ........... 365/185.05 |
| 6,259,126 B1 | 7/2001 | Hsu et al. |
| 6,285,055 B1 | 9/2001 | Gosain et al. |
| 6,297,989 B1 | 10/2001 | Cloud et al. ........... 365/185.08 |
| 6,319,773 B1 | 11/2001 | Noble et al. ............ 438/258 |
| 6,424,011 B1 | 7/2002 | Assaderaghi et al. |
| 6,452,856 B1 | 9/2002 | Forbes et al. .......... 365/230.06 |
| 6,545,904 B2 | 4/2003 | Tran |
| 6,620,659 B2 | 9/2003 | Emmma et al. |

OTHER PUBLICATIONS

Choi, J..D. , et al. ,"A Triple Polysilicon Stacked Flash Memory Cell with Wordline Self–Boosting Programming", *International Electron Devices Meeting, Technical Digest,* Held in Washington, D.C.,(Dec. 7–10, 1997),283–286.

Chung, S..S. ,et al. ,"Performance and Reliability Evaluations of P–Channel Flash Memories with Different Programming Schemes", *International Electron Devices Meeting, Technical Digest,* Washington, D.C.,(Dec. 1997),295–298.

Crowder, S..,et al. ,"Trade–offs in the Integration of High Performance Devices with Trench Capacitor DRAM", *Dig. Int. Electron Devices Meeting, Washington, D.C.,* (Dec. 1997),pp. 45–48.

Forbes, L..,et al. ,"Field Induced Re–Emission of Electrons Trapped in SiO", *IEEE Transactions on Electron Devices, ED–26 (11),* Briefs,(Nov. 1979),pp. 1816–1818.

Hodges, D..A. ,et al. , *Analysis and Design of Digital Integrated Circuits,* McGraw–Hill Book Company, 2nd Edition,(1988),394–396.

Hwang, N..,et al. ,"Tunneling and Thermal Emission of Electrons from a Distribution of Deep Traps in SiO", *IEEE Transactions on Electron Devices, 40(6),* (Jun. 1993),pp. 1100–1103.

Ishiuchi, H..,et al. ,"Embedded DRAM Technologies", *IEDM Technical Digest,* (1997),33–36.

Kang, H..K. ,et al. ,"Highly Manufacturable Process Technology for Reliable 256 Mbit and 1 Gbit DRAMs", *IEEE,* (1994),635–638.

Kato, M..,et al. ,"A Shallow–Trench–Isolation Flash Memory Technology with a Source–Bias Programming Method", *International Electron Devices Meeting, Technical Digest,* Held in San Francisco, CA,(Dec. 8–11, 1996), 177–180.

Kobayashi, T..,et al. ,"A 0.24–micrometer Cell Process with 0.18–micrometer Width Isolation and 3–D Interpoly Dielectric Films for 1–Gb Flash Memories", *International Electron Devices Meeting, Technical Digest,* Held in Washington, D.C.,(Dec. 7–10, 1997),275–278.

Oashi, T..,et al. ,"16Mb DRAM/SOI Technologies for Sub–1V Operation", *International Electron Devices Meeting, Technical Digest,* Held in San Francisco, CA,(Dec. 8–11, 1996),609–612.

Shen, S..,et al. ,"Novel Self–Convergent Programming Scheme for Multi–Level P–Channel Flash Memory", *International Electron Devices Meeting, Technical Digest,* Held in Washington, D.C.,(Dec. 7–10, 1997),287–290.

Shimizu, K..,et al. ,"A Novel High–Density 5F NAND STI Cell Technology Suitable for 256Mbit and 1Gbit Flash Memories", *IEEE,* (1997),271–274.

Sunouchi, K..,et al. ,"240nm Pitch 4GDRAM Array MOSFET Technologies with X–ray Lithography", *International Electron Devices Meeting, Technical Digest,* Held in San Francisco, CA,(Dec. 8–11, 1996),601–604.

Togo, M..,et al. ,"A Salicide–Bridged Trench Capacitor with a Double–Sacrificial—Si N—Sidewall (DSS) for High–Performance Logic–Embedded DRAMs", *International Electron Devices Meeting, Technical Digest,* (1997),37–40.

DRAM TECHNOLOGY COMPATIBLE PROCESSOR/MEMORY CHIPS

This application is a Divisional of U.S. application Ser. No. 09/261,598, filed Feb. 26, 1999 now U.S. Pat. No. 6,452,856 which is incorporated herein.

RELATED APPLICATIONS

This application is related to commonly assigned applications, U.S. application Ser. No. 09/259,493, filed Feb. 26, 1999, now U.S. Pat. No. 6,380,581, U.S. application Ser. No. 09/261,597, filed Feb. 26, 1999, now U.S. Pat. No. 6,297,989, and U.S. application Ser. No. 09/261,479, filed Feb. 26, 1999, now U.S. Pat. No. 6,256,225 which are hereby incorporated by reference.

FIELD OF THE INVENTION

The present invention relates generally to semiconductor integrated circuits and, more particularly, to DRAM technology compatible processor/memory chips.

BACKGROUND OF THE INVENTION

Many products need various amounts of memory. Two of the most useful types of memory are high speed, low cost memory typically implemented as Dynamic Random Access Memory (DRAM) and non-volatile memory typically implemented as Electrically Erasable and Programmable Read Only Memory (EEPROM) or Flash memory. The ability to combine DRAM and EEPROM styles of memory, as well as logic and data processing functions implemented by Programmable Logic Arrays (PLA's) especially if little or no additional manufacturing complexity is required, would allow a number of cost effective applications that do not currently exist or that, heretofore were too costly to be commercially viable.

With the increasing array density of successive generations of DRAM chips, the attractiveness of merging other functions onto the chip also increases. However, any successful merged technology product must be cost competitive with the existing alternative of combining separate chips at the card or package level, each being produced with independently optimized technologies. Any significant addition of process steps to an existing DRAM technology in order to provide added functions such as high speed logic, SRAM or EEPROM becomes rapidly cost prohibitive due to the added process complexity cost and decreased yield. Thus, there is a need for a means of providing additional functions on a DRAM chip with little or no modification of the DRAM optimized process flow.

Among the desired additional functions, EEPROM is one for which the differences between the separately optimized technologies is the greatest. The typical EEPROM cell consists of a MOSFET with two stacked gates, a floating gate directly over the device channel and a control gate atop and capacitively coupled to it.

It would be very desirable to reduce all the major elements of a PC on to a single chip, including CPU, memory and input/output. While at the present time it may not be possible to make a whole PC on a single die, many processor like functions might most conveniently be embedded on the DRAM die. PLAs on a DRAM die would be well suited for memory address correction/repair by changing the addresses to remove faulty rows/columns, and replace them with functional ones. An example of a redundancy repair scheme is shown in U.S. Pat. No. 5,324,681 issued Lowrey on Jun. 28, 1994. Another is provided in U.S. Pat. No. 4,051,354 issued Choate on Sep. 27, 1997. Another is provide in U.S. Pat. No. 5,327,380 issued Kersh III on Jul. 5, 1994. None of these, however, incorporate an optimized DRAM technology process flow. PLAs on a DRAM die would also be desirable for use as dedicated processors embedded on the DRAM chip.

Recent publications outline the problems in trying to embed DRAMs in high performance ULSI logic. The conclusions are that because of the height differences between conventional stacked capacitor DRAM cells and high performance logic circuits that this can only be reasonably accomplished with trench capacitor DRAMS.

Modem DRAM technologies are driven by market forces and technology limitations to converge upon a high degree of commonality in basic cell structure. For the DRAM technology generations from 4 Mbit through 1 Gbit, the cell technology has converged into two basic structural alternatives; trench capacitor and stacked capacitor. A method for utilizing a trench DRAM capacitor technology to provide a compatible EEPROM cell has been described in U.S. Pat. No. 5,598,367. A different approach is needed for stacked capacitors however.

Thus, there is a need for merging processor and memory functions on a single DRAM chip. Similarly, there is a need for using PLAs on a DRAM chip as decoder devices. It is desirable that such processor/PLA capability be fabricated onto the DRAM chip with little or no modification of the DRAM optimized process flow.

SUMMARY OF THE INVENTION

The above mentioned problems for merging processor/PLAs and memory functions on a single DRAM chip as well as other problems are addressed by the present invention and will be understood by reading and studying the following specification. The present invention includes a compact non-volatile memory cell structure formed using a DRAM process technology.

The present invention includes a programmable logic array having a first logic plane that receives a number of input signals. The first logic plane has a plurality of non-volatile memory cells arranged in rows and columns that are interconnected to provide a number of logical outputs. A second logic plane is provided which has a number of non-volatile memory cells arranged in rows and columns that receive the outputs of the first logic plane and that are interconnected to produce a number of logical outputs such that the programmable logic array implements a logical function. Each non-volatile memory cell includes a metal oxide semiconductor field effect transistor (MOSFET). Each non-volatile memory cell includes a stacked capacitor formed according to a dynamic random access memory (DRAM) process. And, each non-volatile memory cell includes an electrical contact that couples the stacked capacitor to a gate of the MOSFET.

Another embodiment of the present invention includes an address decoder for a memory device. The address decoder includes a number of address lines and a number of output lines. The address lines, and the output lines form an array. A number of non-volatile memory cells are disposed at intersections of output lines and address lines. Each non-volatile memory cell includes a metal oxide semiconductor field effect transistor (MOSFET), a stacked capacitor formed according to a dynamic random access memory (DRAM) process, and an electrical contact that couples the stacked capacitor to a gate of the MOSFET. The nonvolatile memory cells are selectively programmed such that the non-volatile memory cells implement a logic function that selects an output line responsive to an address provided to the address lines.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DESCRIPTION OF THE PREFERRED EMBODIMENTS

Figure 1:
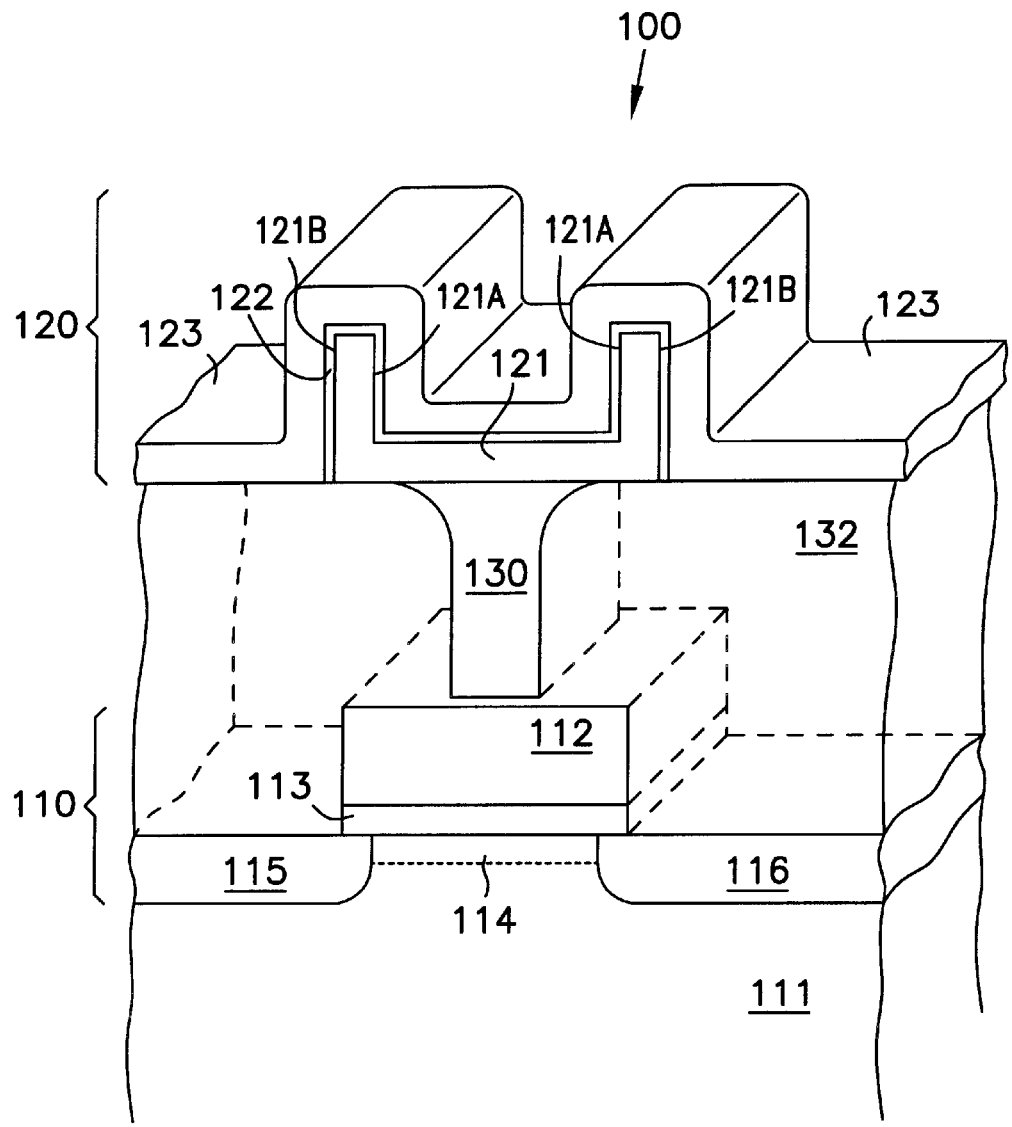
FIG. 1 is a perspective view illustrating in detail the make up of each nonvolatile memory cell according to the teachings of the present invention.

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

FIG. 1 is a perspective view illustrating in detail the make up of the nonvolatile memory cell, e.g. 100, according to the teachings of the present invention. The non-volatile memory cell 100 includes all the embodiments of the non-volatile memory cell structure presented and described in detail in the co-filed application attorney docket number 303.556us1, entitled "DRAM Technology Compatible Non-volatile Memory Cells," by Wendell P. Noble and Eugene H. Cloud, which is hereby incorporated by reference in its entirety.

As shown in FIG. 1, the non-volatile memory cell structure 100 includes a MOSFET 110 and a capacitor 120 fabricated using conventional DRAM process steps. In one embodiment, the MOSFET 110 includes an n-channel metal oxide semiconductor (NMOS) transistor 110 formed in a semiconducting substrate 111. The MOSFET 110 includes a gate 112 separated by a gate oxide 113 from a channel region 114 of the MOSFET 110. In one embodiment, the gate oxide 113 has a thickness of less than 100 Angstroms (Å) and acts as a tunneling oxide. Gate 112 includes a polysilicon gate 112, a polycide gate 112, salicided gate structure, or other conductive gate material as known to one of ordinary skill in the art of DRAM transistor fabrication. The channel region 114 couples a first diffused region 115 to a second diffused region 116. The DRAM transistor is formed according to a conventional, DRAM optimized process flow, as is known to those of ordinary skill in the art of DRAM chip fabrication.

As shown in FIG. 1, the capacitor 120 is formed in a subsequent layer above the MOSFET 110. The capacitor 120 is separated from the MOSFET 110 by an insulator layer 132. Capacitor 120 includes a bottom plate 121 and a top plate 123, or a control gate 123 which is separated from the bottom plate 121 by a dielectric layer or capacitor dielectric 122. The bottom plate 121 serves as a storage node 121 and the top plate serves as a plate capacitor 123 for the capacitor 120. The bottom plate 121 comprises a floating gate 121 for the non-volatile memory cell 100 which is connected through insulator layer 132 to gate 112 by an electrical contact 130. In one embodiment, the entire stack 121, 130 and 112 serves as a floating gate. The top plate 123 comprises a control gate 123 for the non-volatile memory cell 100.

In one embodiment, shown in FIG. 1, capacitor 120 includes a stacked capacitor which is cup shaped 120. The bottom plate 121 has interior walls 121A and exterior walls 121B. The capacitor dielectric 122 is conformal to the interior walls 121A and the exterior walls 121B of the bottom plate 121. The top plate 123 is conformal to the capacitor dielectric 122. A portion of the top plate 123 is located within and opposes the interior walls 121A of the bottom plate 121, separated therefrom by the capacitor dielectric 122. A portion of the top plate 123 is locate outside of and opposes the exterior walls 121B of the bottom plate 121, separated therefrom by the capacitor dielectric 122. In one embodiment, the capacitor dielectric has a thickness of less than the equivalent of 100 Angstroms (Å) of $SiO_2$. As one of ordinary skill in the art will understand upon reading this disclosure, other of stacked capacitor 120 configurations, such as domes or flat plates, are applicable. To create an array of such cells, such as shown in the co-filed application attorney docket number 303.556us1, entitled "DRAM Technology Compatible Non-volatile Memory Cells," by Wendell P. Noble and Eugene H. Cloud, bit lines are connected to the first and second diffused regions, 115 and 116. For minimum cell size, the bit lines may consist of diffusion lines which traverse the array. By then patterning the top plate 123 of the stacked capacitor 120 into strips orthogonal to the diffused bit lines, control gate 123 word lines couple to the bottom plate 121 and the MOSFET 110 of the non-volatile memory cell 100 structure.

The resulting non-volatile memory cell 100 has the same physical and electrical features as conventional non-volatile memory cells and thus conventional methods of programming (e.g. channel hot electron "CHE" injection) and erasure (e.g. Fowler Nordheim "F-N" tunneling) may be used. However, whereas conventional non-volatile memory cells have capacitive coupling ratios of 0.6 to 1.0, as defined in the co-filed application attorney docket number 303.556us1, entitled "DRAM Technology Compatible Non-volatile Memory Cells," by Wendell P. Noble and Eugene H. Cloud, the inherently high stacked capacitor 120 surface area of the present invention can provide coupling ratios many times this. Therefore the gate voltage swings needed for programming and erasure are greatly reduced.

Figure 2:
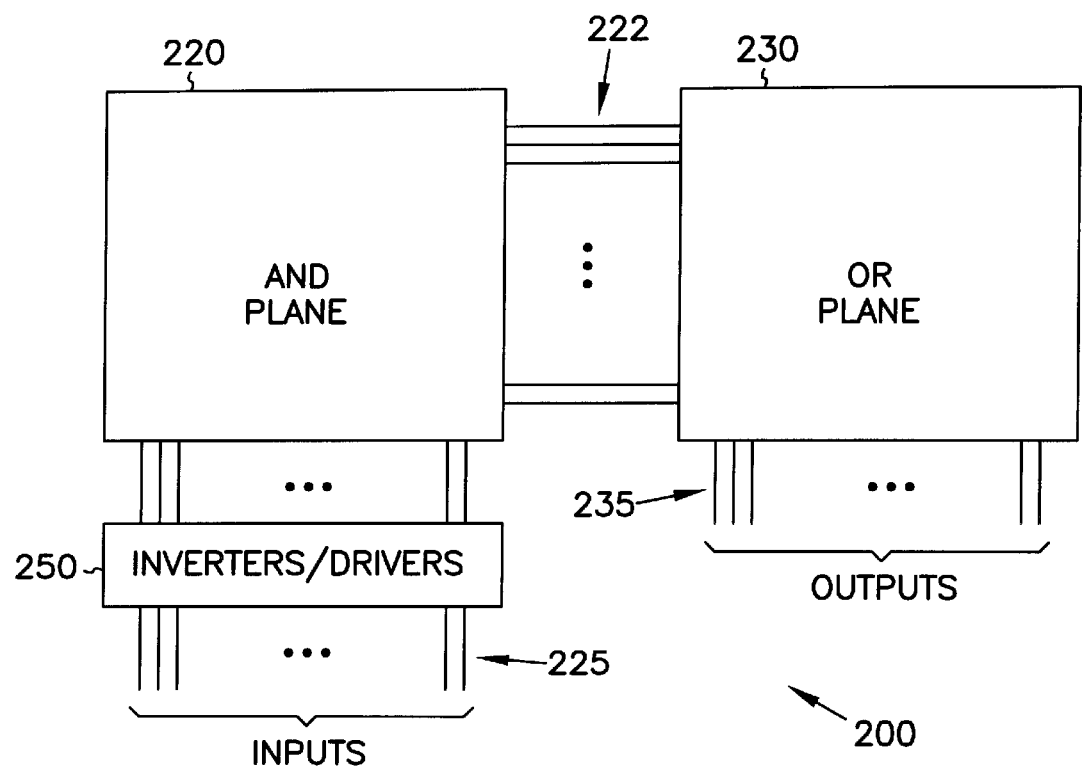
FIG. 2 is a simplified block diagram of a field programmable logic array (PLA) according to the teachings of the present invention.

FIG. 2 is a simplified block diagram of a field programmable logic array (PLA) 200 according to the teachings of the present invention. PLA 200 includes two major constituents: a first logic plane 220 and a second logic plane 230. The first and second logic planes 220 and 230 are formed using an array of non-volatile memory cells 100 as presented and described in detail in connection to FIG. 1. In one embodiment, the first and second logic planes 220 and 230 each comprise NOR logic circuits such that PLA 200 implements NOR—NOR logic. In other embodiments, first and second logic planes 220 and 230 are constructed from arrays of non-volatile memory cells 100 that are configured to implement AND-OR, OR-AND, NAND—NAND, NOR-OR, OR-NOR, AND-NOR, and NAND-AND logic.

Input lines 225 are coupled to receive a number of input signals. Inverters/drivers 250 are coupled to the input lines 225 such that first logic plane 220 is capable of receiving each of the input signals and their complements. First logic plane 220 produces a number of output signals that are logical combinations of the signals from inverters/drivers 250. The output signals from first logic plane 220 are provided to second logic plane 230 via interconnection lines 222. Second logic plane 230 produces a number of output signals that are logical combinations of the signals from interconnection lines 222.

In addition, various control circuits and signals not detailed herein initiate and synchronize the PLA 200 operation as known to those skilled in the art. The PLA 200 implementation described with respect to FIG. 2 is illustrative only and is not intended to be exclusive or limiting.

Figure 3:
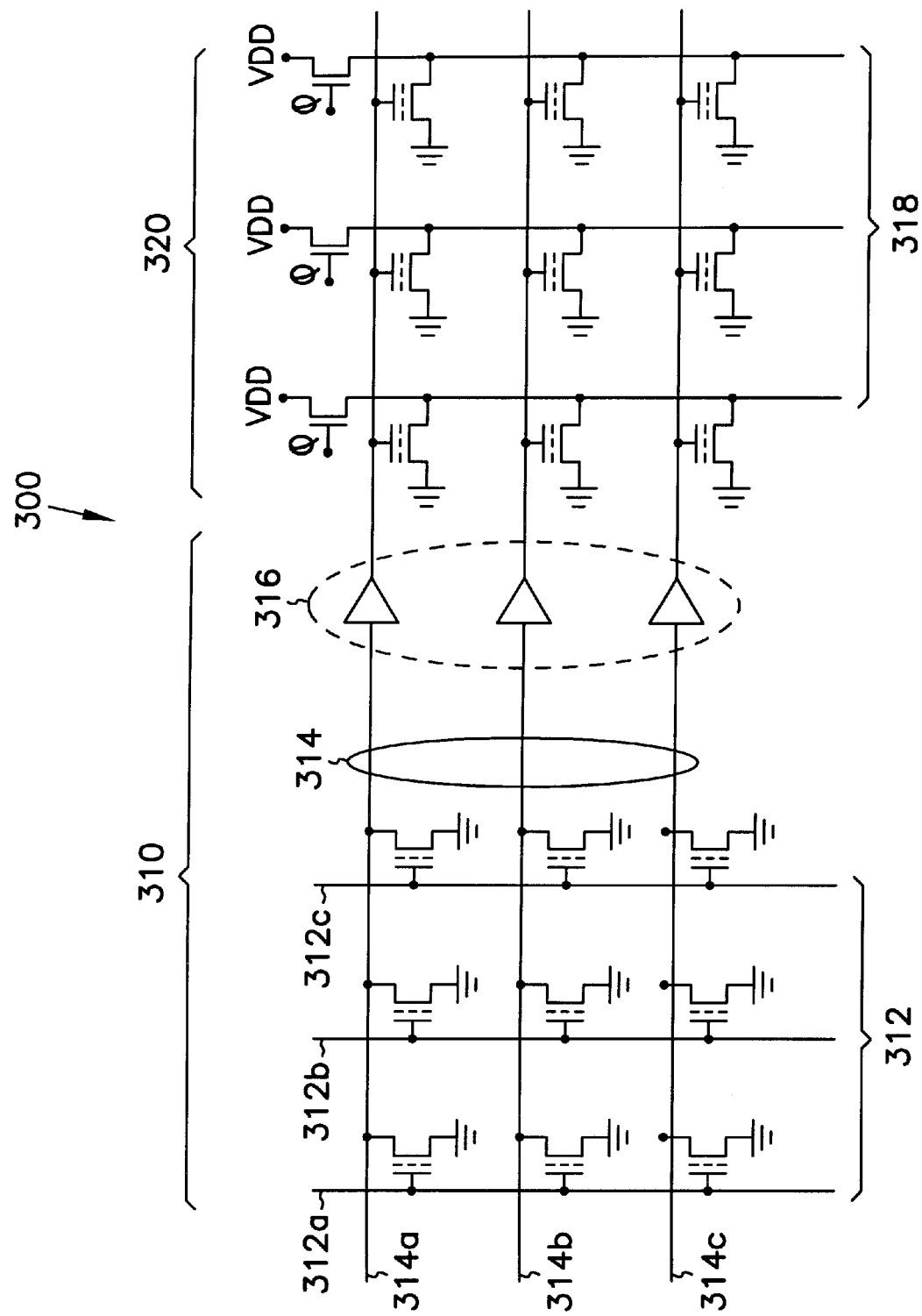
FIG. 3 is a schematic diagram illustrating generally an architecture of one embodiment of a programmable logic array (PLA) constructed according to the teachings of the present invention.

FIG. 3 is a schematic diagram illustrating generally an architecture of one embodiment of a programmable logic array (PLA), indicated generally at 300, and constructed according to the teachings of the present invention. PLA 300 implements an illustrative logical function using a two level logic approach. Specifically, PLA 300 includes first and second logic planes 310 and 320. In this example, the logic function is implemented using NOR—NOR logic. First and second logic planes 310 and 320 each include an array of non-volatile memory cells 100, as presented and described in detail in connection to FIG. 1, that are configured to implement the logical function of PLA 300.

It is noted that the configuration of FIG. 3 is provided by way of example and not by way of limitation. Specifically, the teachings of the present application are not limited to programmable logic arrays in the NOR—NOR approach. Further, the teachings of the present application are not limited to the specific logical function shown in FIG. 3. Other logical functions can be implemented in a programmable logic array with non-volatile memory cells 100 using any one of the various two level logic approaches.

First logic plane 310 receives a number of input signals at input lines 312. In this example, no inverters are provided for generating complements of the input signals. However, first logic plane 310 can include inverters to produce the complementary signals when needed in a specific application.

First logic plane 310 includes a number of non-volatile memory cells 100 that form an array. The non-volatile memory cells 100 are located at the intersection of input lines 312, and interconnect lines 314. Not all of the non-volatile memory cells 100 are operatively conductive in the first logic plane. Rather, the non-volatile memory cells 100 are selectively programmed to respond to the input lines 312 and change the potential of the interconnect lines 314 so as to implement a desired logic function. Thus, some non-volatile memory cells 100 are left unprogrammed. This selective interconnection is referred to as programming since the logical function implemented by the programmable logic array is enterred into the array by the non-volatile memory cells 100 that are used at the intersections of input lines 312, and interconnect lines 314 in the array.

In this embodiment, each of the interconnect lines 314 acts as a NOR gate for the input lines 312 that are connected to the interconnect lines 314 through the non-volatile memory cells 100 of the array. For example, interconnection line 314a acts as a NOR gate for the signals on input lines 312a, 312b and 312c. That is, interconnect line 314a is maintained at a high potential unless one or more of the non-volatile memory cells 100 that are coupled to interconnect line 314a are turned on by a high logic level signal on one of the input line 312. When a control gate address is activated, through input lines 312, each non-volatile memory cell 100 either conducts or does not conduct depending on the charge stored upon its floating gate, this performs the NOR positive logic circuit function, an inversion of the OR circuit function results from inversion of data onto the interconnect lines 314 through the non-volatile memory cells 100 of the array. The sense amplifiers 316 at the ends of the interconnect lines 314 are used as amplifiers and drivers for the passing data into the second array 320. In this manner a NOR—NOR is most easily implemented utilizing the normal DRAM array structure, only the function of devices is changed.

In a similar manner, second logic plane 320 comprises a second array of non-volatile memory cells 100 that are selectively programmed to provide the second level of the two level logic needed to implement a specific logical function. In this embodiment, the array of non-volatile memory cells 100 is also configured such that the output lines 318 comprise a logical NOR function of the signals from the interconnection lines 314 that are coupled to particular output lines through the non-volatile memory cells 100 of the second logic plane 320.

Figure 4:
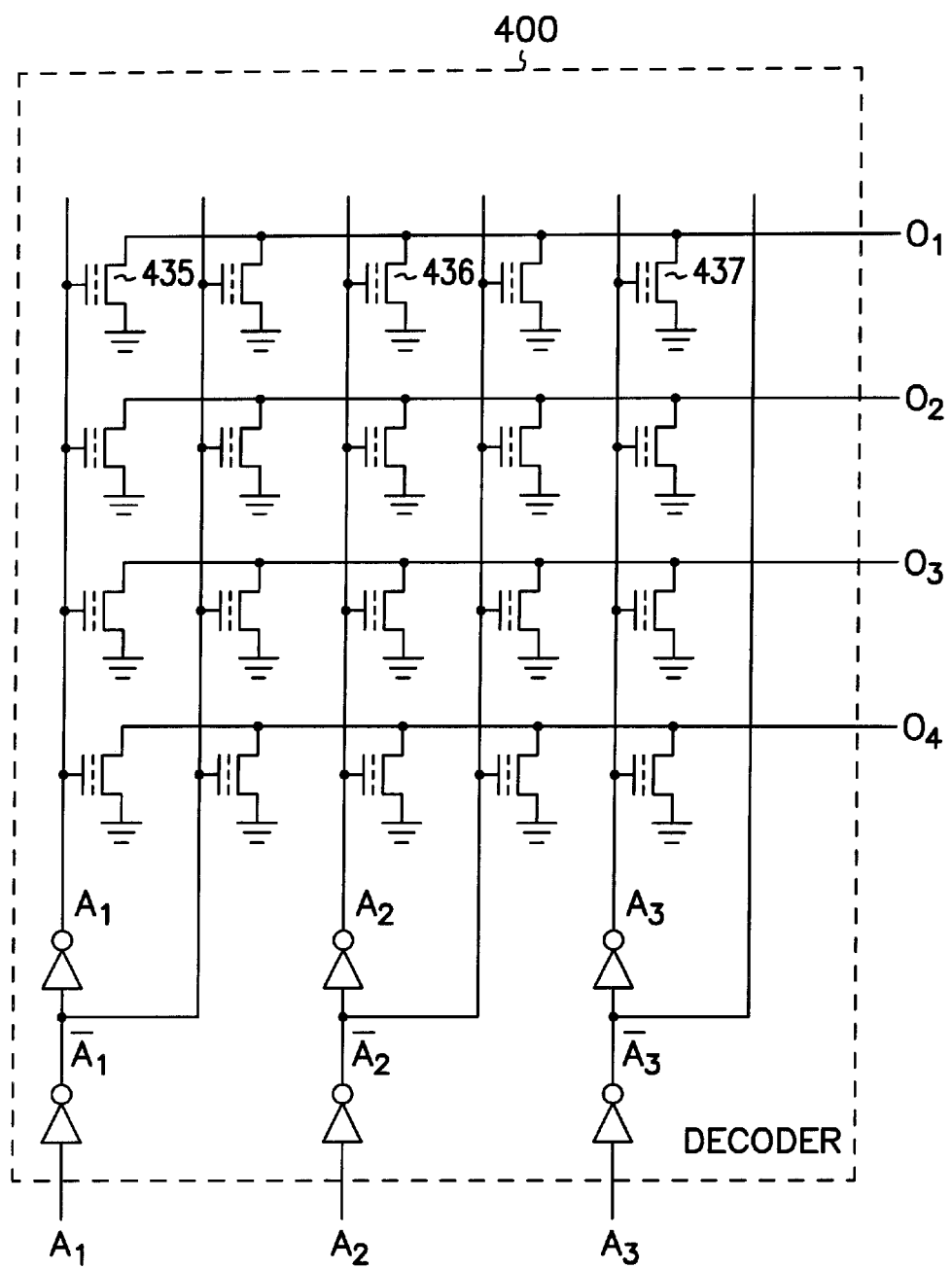
FIG. 4 is a schematic diagram illustrating generally an architecture of one embodiment of a programmable decoder according to the teachings of the present invention.

FIG. 4 is a schematic diagram that illustrates one embodiment of a decoder, indicated generally at 400, that is constructed according to the teachings of the present invention. Decoder 400 can be used, for example, as a memory address decoder such as a column decoder or a row decoder.

Decoder 400 of FIG. 4 includes a number of non-volatile memory cells, e.g. 435, as described in detail in connection with FIG. 1. The number of nonvolatile memory cells are formed at the intersection of output lines $O_1$ through $O_4$ with either an address line $A_1$ through $A_3$ or inverse address line $\overline{A}_1$ through $\overline{A}_3$. The inverse address lines are coupled to associated address lines through an inverter as shown. For example, non-volatile memory cell is located at the intersection of address line $A_1$ and output line $O_1$. Decoder 400 is programmed and reprogrammed according to the techniques generally know for programming conventional non-volatile memory cells. Any selected number of the non-volatile memory cells be operatively coupled to the address lines, $A_1$ through $A_3$, inverse address lines, $\overline{A}_1$ through $\overline{A}_3$, or the output lines, $O_1$ through $O_4$. In this manner, the number of non-volatile memory cells are selectively programmed into the array in order to implement a desired logical function.

In this embodiment of FIG. 4, each of the output lines, $O_1$ through $O_4$, implements a NOR logic function for the address lines, $A_1$ through $A_3$, and inverse address lines, $\overline{A}_1$ through $\overline{A}_3$, that are connected to it through the vertical transistors. For example, output line $O_1$ is coupled to the drains of non-volatile memory cells 435, 436, and 437. Non-volatile memory cells 435, 436, and 437 have gates, as shown in detail in FIG. 1, that are coupled to receive signals from address lines $A_1$, $A_2$, and $A_3$, respectively. Output line $O_1$ produces the logical NOR of the logic values provided on address lines $A_1$, $A_2$, and $A_3$. Output line $O_1$ produces a low logic level when any one of the address lines $A_1$, $A_2$, and $A_3$ is brought to a high logic level and the floating gate on an associated non-volatile memory cell, as shown in detail in FIG. 1, is absent of charge (e.g. in an unprogrammed state). Further, output line $O_1$ produces a high logic level only when the address lines $A_1$, $A_2$, and $A_3$ are all at a low logic level.

The remaining output lines are selectively coupled to other non-volatile memory cells as shown to implement additional NOR functions. These NOR functions are chosen such that the input address lines, $A_1$, $A_2$, and $A_3$, (and inverse address lines, $\overline{A}_1$, $\overline{A}_2$, $\overline{A}_3$) can be used to selectively address the output lines, $O_1$ through $O_4$. It is noted that the logical functions implemented in array 400 are shown by way of illustration and not by way of limitation. Other logical functions can be implemented without departing from the spirit and scope of the present invention.

Generally speaking, decoder 400 can be fabricated with N address input lines to uniquely select $2^N$ output lines. Thus, in an alternative embodiment, two address lines, $A_1$ and $A_2$, are used to selectively access four output lines, $O_1$ through $O_4$. In this embodiment, the purpose of address line $A_3$ is to hold the output lines at a low level when an address signal has not yet been received.

Figure 5:
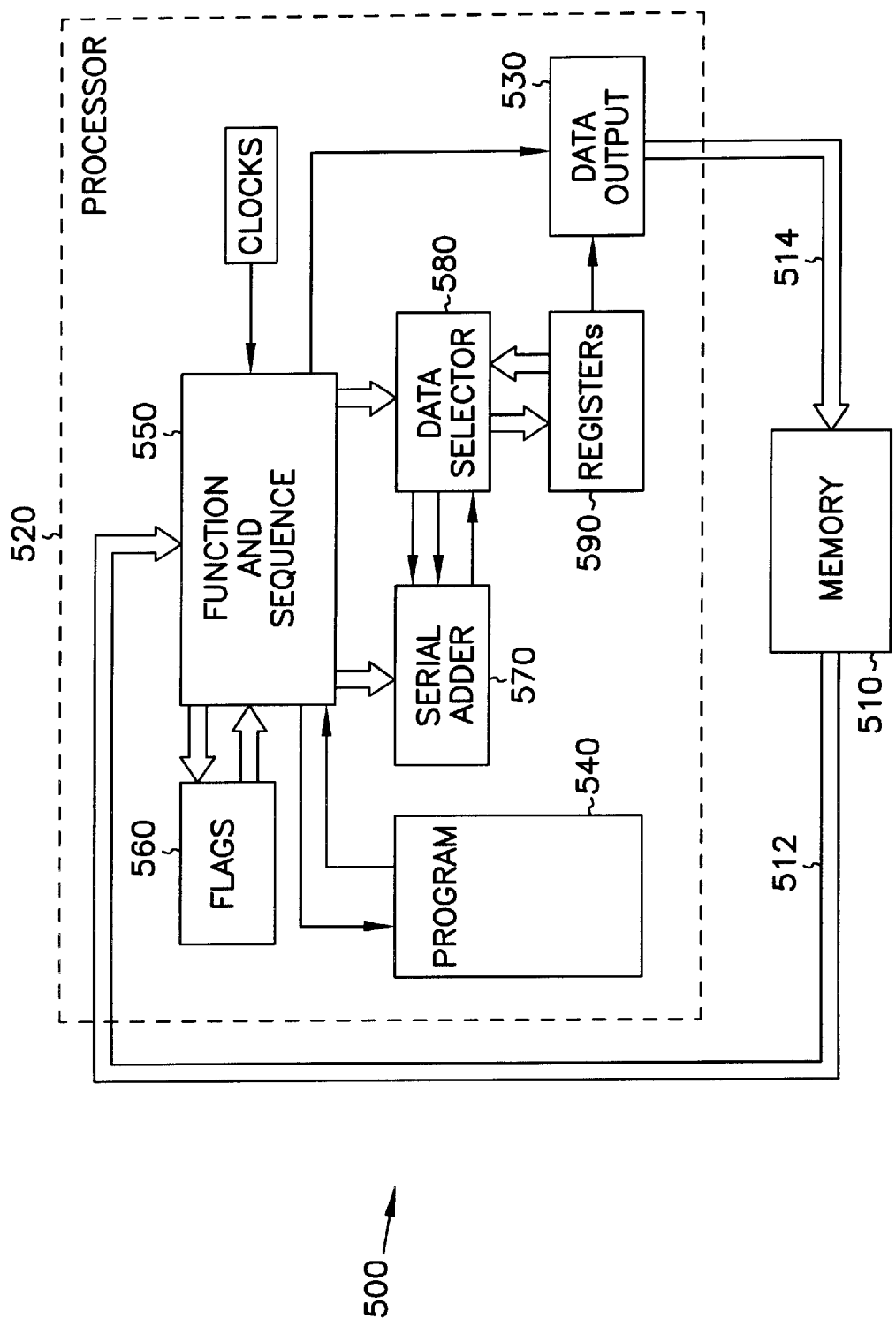
FIG. 5 illustrates application of programmed logic arrays (PLA's), formed according to the teaching of the present invention, embedded processor on a DRAM die.

FIG. 5 illustrates application of PLA's, structure according to the teachings of the present invention, as an embedded processor on a DRAM die 500. In the embodiment shown in FIG. 5, data from the DRAM memory arrays 510 is input to the processor 520 at the top of the FIG. 5 via interconnect lines 512. At the end of the processing, as defined by the program selected for data processing from the program circuit 540, processed data is sent back for storage in the DRAM arrays 510 from a data output circuit 530 via interconnect lines 514. In one embodiment of FIG. 5, the individual cell type for implementation of a particular processor 520 function includes a program stored in the program circuit 540 using EEPROM cells. Memory is held in the memory arrays 510 and registers 590 using conventional DRAM cells. In this embodiment, the individual cell type for implementation of the particular processor 520 function includes a function and sequence circuit 550, FLAGS 560, one or more serial adders 570, and a data selector 580 using PLAs constructed according to teachings of the present invention. As is shown in FIG. 5, most functions in the processor can be implemented using PLA's according to the teachings of the present invention.

Conclusion

Thus, the ability to provide processor/PLA capability on a DRAM chip according to a DRAM optimized process flow has been shown by the present invention. This disclosure provides not only a technique for combining logic (implemented with PLA's) with stacked capacitor DRAM cells but also describes the alternative approach to improving system performance, namely "embedded logic in DRAMs", not DRAMs embedded in logic.

The ability to process data stored on the DRAM die allows a number of cost effective applications that do not currently exist or that, heretofore were to costly to be commercially viable. It is particularly suited to processing data which requires a large number of parallel operations. The use of programmable embedded processors avoids the necessity of transferring intermediate data on and off chip through input/output drivers and circuits and greatly speeds data processing. This aids in applications such as a dedicated signal processor in which data may be loaded in to a range of DRAM addresses and then having an algorithm such as the Fast Fourier Transform (FFT), performed on the data with the results stored in another range of DRAM memory all on the same chip. The user application can retrieve the resultant processed data from the memory. The ability of an on chip non-volatile memory means that the processor program instructions, implementing various algorithms, can not only be stored on the die but also can be easily changed to suit a variety of applications. The PLA's of the present invention allow powerful techniques for data processing which are especially useful for parallel data processing applications such as image processing or general Digital Signal Processing (DSP). The PLA's of the present invention are also suitable for making general purpose processors embedded in a DRAM by which one could emulate a general purpose processor such as an 80C251, an 8 bit general purpose microprocessor. Here, 5–10 Mbits of the DRAM of the DRAM chip can be configured for PLA's, non-volatile storage, and where DRAM serves as registers.

Thus, the ability to provide processor/PLA capability on a DRAM chip according to a DRAM optimized process flow has been shown by the present invention. This disclosure provides not only a technique for combining logic (implemented with PLA's) with stacked capacitor DRAM cells but also describes the alternative approach to improving system performance, namely "embedded logic in DRAMs", not DRAMs embedded in logic.

The present invention includes a programmable logic array having a first logic plane that receives a number of input signals. The first logic plane has a plurality of non-volatile memory cells arranged in rows and columns that are interconnected to provide a number of logical outputs. A second logic plane is provided which has a number of non-volatile memory cells arranged in rows and columns that receive the outputs of the first logic plane and that are interconnected to produce a number of logical outputs such that the programmable logic array implements a logical function. Each non-volatile memory cell includes a metal oxide semiconductor field effect transistor (MOSFET). Each non-volatile memory cell includes a stacked capacitor formed according to a dynamic random access memory (DRAM) process. And, each non-volatile memory cell includes an electrical contact that couples the stacked capacitor to a gate of the MOSFET.

Another embodiment of the present invention includes an address decoder for a memory device. The address decoder includes a number of address lines and a number of output lines. The address lines, and the output lines form an array. A number of non-volatile memory cells are disposed at intersections of output lines and address lines. Each non-volatile memory cell includes a metal oxide semiconductor field effect transistor (MOSFET), a stacked capacitor formed according to a dynamic random access memory (DRAM) process, and an electrical contact that couples the stacked capacitor to a gate of the MOSFET. The non-volatile memory cells are selectively programmed such that the non-volatile memory cells implement a logic function that selects an output line responsive to an address provided to the address lines.

Methods, integrated circuits, and electronic systems are similarly provided and included within the scope of the present invention.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A programmable logic array, comprising:
   a first logic plane that receives a number of input signals, the first logic plane having a plurality of non-volatile memory cells arranged in rows and columns that are interconnected to provide a number of logical outputs;
   a second logic plane having a number of non-volatile memory cells arranged in rows and columns that receive the outputs of the first logic plane and that are interconnected to produce a number of logical outputs such that the programmable logic array implements a logical function; and
   wherein the non-volatile memory cells each include:
      a metal oxide semiconductor field effect transistor (MOSFET);
      a stacked capacitor formed according to a dynamic random access memory (DRAM) process, the stacked capacitor being adapted to provide a coupling ratio of greater than 1.0; and
      an electrical contact that couples the stacked capacitor to a gate of the MOSFET.

2. The programmable logic array of claim 1, wherein the first logic plane and the second logic plane each comprise NOR planes.

3. The programmable logic array of claim 1, wherein the substrate is a bulk semiconductor.

4. The programmable logic array of claim 1, wherein the electrical contact includes a polysilicon plug.

5. The programmable logic array of claim 1, wherein the working surface of the substrate includes an ins insulating layer formed on top of an underlying semiconductor.

6. The programmable logic array of claim 1, wherein the programmable logic array is operatively coupled to a computer system.

7. The programmable logic array of claim 1, wherein the stacked capacitor includes a fin type capacitor.

8. The logic array of claim 1, wherein the stacked capacitor includes a storage node, a capacitor dielectric, and a plate conductor and wherein the electrical contact couples the storage node of the stacked capacitor to the gate of the MOSFET.

9. A programmable logic array, comprising:
   a first logic plane that receives a number of input signals, the first logic plane having a plurality of non-volatile memory cells arranged in rows and columns that are interconnected to provide a number of logical outputs; and
   a second logic plane having a number of non-volatile memory cells arranged in rows and columns that receive the outputs of the first logic plane and that are interconnected to produce a number of logical outputs such that the programmable logic array implements a logical function,
   wherein the non-volatile memory cells each include:
      a transistor;
      a stacked capacitor formed according to a dynamic random access memory process, the capacitor providing a coupling ratio greater than 1.0; and
      an electrical contact that couples the stacked capacitor to a gate of the transistor.

10. The programmable logic array of claim 9, wherein the implemented logical function includes at least one of NOR—NOR, AND-OR, OR-AND, NAND—NAND, NOR-OR, OR-NOR, AND-NOR, and NAND-AND.

11. The programmable logic array of claim 9, wherein the first logic plane includes inverters adapted to generate complements of the input signals.

12. The programmable logic array of claim 9, wherein the electrical contact includes a polysilicon plug.

13. The programmable logic array of claim 9, the stacked capacitor includes a fin type capacitor.

14. The programmable logic array of claim 9, wherein the stacked capacitor includes a storage node, a capacitor dielectric, and a plate conductor and wherein the electrical contact couples the storage node of the stacked capacitor to the gate of the transistor.

15. The programmable logic array of claim 9, wherein the transistor is a metal oxide semiconductor field effect transistor.

16. A programmable logic array, comprising:
   a first logic plane that receives a number of input signals, the first logic plane having a plurality of non-volatile memory cells arranged in rows and columns that are interconnected to provide a number of logical outputs; and
   a second logic plane having a number of non-volatile memory cells arranged in rows and columns that receive the outputs of the first logic plane and that are interconnected to produce a number of logical outputs such that the programmable logic array implements a logical function,
   wherein the non-volatile memory cells each include:
      a metal oxide semiconductor field effect transistor;
      a cup-shaped stacked capacitor formed according to a dynamic random access memory process, the capacitor providing a coupling ratio greater than 1.0; arid
      an electrical contact that couples the stacked capacitor to a gate of the transistor.

17. The programmable logic array of claim 16, herein the implemented logical function includes at least one of NOR—NOR, AND-OR, OR-AND, NAND—NAND, NOR-OR, OR-NOR, AND-NOR, and NAND-AND.

18. The programmable logic array of claim 16, wherein the first logic plane includes inverters that are adapted to generate complements of the input signals.

19. The programmable logic array of claim 16, the electrical contact includes a polysilicon plug.

20. The programmable logic array of claim 16, the cup-shaped stacked capacitor includes a storage node, a capacitor dielectric, and a plate conductor and wherein the electrical contact couples the storage node of the stacked capacitor to the gate of the transistor.

21. A programmable logic array, comprising:
   a first logic plane that receives a number of input signals, the first logic plane having a plurality of non-volatile memory cells arranged in rows and columns that are interconnected to provide a number of logical outputs; and a second logic plane having a number of non-volatile memory cells arranged in rows and columns that receive the outputs of the first logic plane and that are interconnected to produce a number of logical outputs such that the programmable logic array implements a logical function, wherein the non-volatile memory cells each include:
a metal oxide semiconductor field effect transistor comprising a gate and a channel region separated by a gate oxide;
a stacked capacitor formed according to a dynamic random access memory process, the capacitor providing a coupling ratio greater than 1.0; and
an electrical contact that couples the stacked capacitor to the gate of the transistor.

22. The programmable Logic array of claim 21, wherein the gate oxide has a thickness of less than 100 angstroms.

23. The programmable logic array of claim 21, wherein the gate oxide acts as a tunneling oxide.

24. The programmable logic array of claim 21, wherein the implemented logical function includes at least one NOR—NOR, AND-OR, OR-AND, NAND—NAND, NOR-OR, OR-NOR, AND-NOR, and NAND-AND.

25. The programmable logic array of claim 21, wherein the first logic plane includes inverters that are adapted to generate complements of the input signals.

26. The programmable logic array of claim 21, wherein the electrical contact includes a polysilicon plug.

27. The programmable logic array of claim 21, wherein the stacked capacitor includes a fin type capacitor.

28. The programmable logic array of claim 21, the stacked capacitor includes a storage node, a capacitor dielectric, and a plate conductor and wherein the electrical contact couples the storage node of the stacked capacitor to the gate of the transistor.

29. A programmable logic array, comprising:
a first logic plane that receives a number of input signals, the first logic plane having a plurality of non-volatile memory cells arranged in rows and columns that are interconnected to provide a number of logical outputs; and
a second logic plane having a number of non-volatile memory cells arranged in rows and columns that receive the outputs of the first logic plane and that are interconnected to produce a number of logical outputs such that the programmable logic array implements a logical function,
wherein the non-volatile memory cells each include:
a metal oxide semiconductor field effect transistor;
a stacked capacitor formed according to a dynamic random access memory process, the capacitor providing a coupling ratio greater than 1.0, the capacitor including a bottom plate and a top plate separated by a capacitor dielectric; and
an electrical contact that couples the bottom plate of the stacked capacitor to a gate of the transistor.

30. The programmable logic array of claim 29, wherein the bottom plate serves as a storage node.

31. The programmable logic array of claim 29, wherein the bottom plate comprises a floating gate for the at least one non-volatile memory cell.

32. The programmable logic array of claim 29, the implemented logical function includes at least one of NOR—NOR, AND-OR, OR-AND, NAND—NAND, NOR-OR, OR-NOR, AND-NOR, and NAND-AND.

33. The programmable logic array of claim 29, wherein the first logic plane includes inverters that generate complements of the input signals.

34. The programmable logic array of claim 29, wherein the electrical contact includes a polysilicon plug.

35. The programmable logic array of claim 29, wherein the stacked capacitor includes a fin type capacitor.

36. A programmable logic array, comprising:
a first logic plane that receives a number of input signals, the first logic plane having a plurality of non-volatile memory cells arranged in rows and columns that are interconnected to provide a number of logical outputs; and
a second logic plane having a number of non-volatile memory cells arranged in rows and columns that receive the outputs of the first logic plane and that are interconnected to produce a number of logical outputs such that the programmable logic array implements a logical function,
wherein the non-volatile memory cells each include:
a metal oxide semiconductor field effect transistor;
a cup-shaped stacked capacitor formed according to a dynamic random access memory process, the capacitor providing a coupling ratio greater than 1.0, the capacitor including a bottom plate and a top plate separated by a capacitor dielectric; and
an electrical contact that couples the bottom plate of the stacked capacitor to a gate of the transistor.

37. The programmable logic array of claim 36, herein the bottom plate serves as a storage node.

38. The programmable logic array of claim 36, herein the bottom plate comprises a floating gate for the at least one non-volatile memory cell.

39. The programmable logic array of claim 36, wherein the implemented logical function includes at least one of NOR—NOR, AND-OR, OR-AND, NAND—NAND, NOR-OR, OR-NOR, AND-NOR, and NAND-AND.

40. The programmable logic array of claim 36, wherein the first logic plane includes inverters that are adapted to generate complements of the input signals.

41. The programmable logic array of claim 36, the electrical contact includes a polysilicon plug.

42. A programmable logic al-ray, comprising:
a first logic plane that receives a number of input signals, the first logic plane having a plurality of non-volatile memory cells arranged in rows and columns that are interconnected to provide a number of logical outputs; and
a second logic plane having a number of non-volatile memory cells arranged in rows and columns that receive the outputs of the first logic plane and that are interconnected to produce a number of logical outputs such that the programmable logic array implements a logical function,
wherein the non-volatile memory cells each include:
a metal oxide semiconductor field effect transistor comprising a gate and a channel region separated by a gate oxide;
a cup-shaped stacked capacitor formed according to a dynamic random access memory process, the capacitor providing a coupling ratio greater than 1.0; and
an electrical contact that couples the stacked capacitor to a gate of the transistor.

43. The programmable logic array of claim 42, herein the gate oxide acts as a tunneling oxide.

44. The programmable logic array of claim 42, wherein the implemented logical function includes at least one of NOR—NOR, AND-OR, OR-AND, NAND—NAND, NOR-OR, OR-NOR, AND-NOR, and NAND-AND.

45. The programmable logic array of claim 42, wherein the first logic plane includes inverters that are adapted to generate complements of the input signals.

46. The programmable logic array of claim 43, wherein the electrical contact includes a polysilicon plug.

47. The programmable logic array of claim 42, wherein the stacked capacitor includes a storage node, a capacitor dielectric, and a plate conductor and wherein the electrical contact couples the storage node of the stacked capacitor to the gate of the transistor.

48. A programmable logic array, comprising:

a first logic plane that receives a number of input signals, the first logic plane having a plurality of non-volatile memory cells arranged in rows and columns that are interconnected to provide a number of logical outputs; and a second logic plane having a number of non-volatile memory cells arranged in rows and columns that receive the outputs of the first logic plane and that are interconnected to produce a number of logical outputs such that the programmable logic array implements a logical function;

wherein the non-volatile memory cells each include:

a metal oxide semiconductor field effect transistor comprising a gate and a channel region separated by a gate oxide, the gate oxide being adapted to act as a tunneling oxide;

a stacked capacitor formed according to a dynamic random access memory process, the capacitor providing a coupling ratio greater than 1.0; and an electrical contact that couples the stacked capacitor to a gate of the transistor.

* * * * *

UNITED STATES PATENT AND TRADEMARK OFFICE
CERTIFICATE OF CORRECTION

PATENT NO. : 6,809,985 B2
DATED : October 26, 2004
INVENTOR(S) : Forbes et al.

It is certified that error appears in the above-identified patent and that said Letters Patent is hereby corrected as shown below:

Title page,
Item [75], Inventors, after "Noble," insert -- Jr. --.

Column 2,
Line 14, delete "Modem" and insert -- Modern --, therefor.

Column 6,
Line 63, delete "$A_1$ through $A_3$" and insert -- $\bar{A}_1$ through $\bar{A}_3$ --, therefor.

Column 7,
Lines 4, 10-11, delete "$A_1$ through $A_3$" and insert -- $\bar{A}_1$ through $\bar{A}_3$ --, therefor.
Line 30, delete "$A_1, A_2, A_3$" and insert -- $\bar{A}_1, \bar{A}_2, \bar{A}_3$ --, therefor.

Column 9,
Line 48, delete "ins".
Line 55, insert -- programmable -- before "logic".

Column 10,
Line 21, after "claim 9," insert -- wherein --.
Line 48, delete "arid" and insert -- and --, therefor.
Line 51, delete "herein" and insert -- wherein --, therefor.
Lines 58 and 60, after "claim 16," insert -- wherein --.

Column 11,
Line 19, delete "Logic" and insert -- logic --, therefor.
Line 34, after "claim 21," insert -- wherein --.
Line 66, after "claim 29," insert -- wherein --.

Column 12,
Lines 31, 33 and 66, delete "herein" and insert -- wherein -- therefor.
Line 43, after "claim 36," insert -- wherein --.
Line 45, delete "al-ray" and insert -- array --, therefor.

UNITED STATES PATENT AND TRADEMARK OFFICE
CERTIFICATE OF CORRECTION

PATENT NO. : 6,809,985 B2
DATED : October 26, 2004
INVENTOR(S) : Forbes et al.

It is certified that error appears in the above-identified patent and that said Letters Patent is hereby corrected as shown below:

Column 13,
Line 8, delete "claim 43" and insert -- claim 42 --, therefor.

Signed and Sealed this

Twenty-fourth Day of May, 2005

JON W. DUDAS
*Director of the United States Patent and Trademark Office*